United States Patent
Inatsugu

(10) Patent No.: US 6,821,820 B2
(45) Date of Patent: Nov. 23, 2004

(54) LEAD FRAME MANUFACTURING METHOD

(75) Inventor: Tatsuya Inatsugu, Nagano (JP)

(73) Assignee: Shinko Electric Industries Co., Ltd., Nagano (JP)

(*) Notice: Subject to any disclaimer, the term of this patent is extended or adjusted under 35 U.S.C. 154(b) by 52 days.

(21) Appl. No.: 10/373,199

(22) Filed: Feb. 26, 2003

(65) Prior Publication Data

US 2003/0164535 A1 Sep. 4, 2003

(30) Foreign Application Priority Data

Mar. 4, 2002 (JP) ........................................ 2002-057897

(51) Int. Cl.[7] ........................ H01L 21/50; H01L 23/495
(52) U.S. Cl. ........................ 438/123; 257/666; 257/674; 257/677
(58) Field of Search ................................ 257/666, 670, 257/674, 676, 677; 438/123

(56) References Cited

U.S. PATENT DOCUMENTS

| 4,862,246 | A | * | 8/1989 | Masuda et al. | ............. 257/666 |
| 5,230,144 | A | * | 7/1993 | Ootsuki | ................ 29/827 |
| 5,633,205 | A | * | 5/1997 | Tsuchiya et al. | ............ 29/827 |
| 6,294,409 | B1 | * | 9/2001 | Hou et al. | .................. 438/123 |
| 6,355,502 | B1 | * | 3/2002 | Kang et al. | ................ 438/110 |
| 6,664,133 | B2 | * | 12/2003 | Abe et al. | .................. 438/111 |

FOREIGN PATENT DOCUMENTS

JP     2002-368176     12/2002

* cited by examiner

*Primary Examiner*—Nathan J. Flynn
*Assistant Examiner*—Victor A. Mandala, Jr.
(74) *Attorney, Agent, or Firm*—Armstrong, Kratz, Quintos, Hanson & Brooks, LLP

(57) ABSTRACT

There are provided the steps of forming a plurality of opening portions by punching predetermined portions of a metal plate, forming crushed portions by pushing crushed margin portions, which are defined in vicinity of both side edge portions of the opening portions of the metal plate, to reduce a thickness, defining a width W3 between a side surface portion and a center portion to assure an interval between lead portions and also defining a width of a top end portion and a width of a base portion by punching center portions of the crushed portions except predetermined both-side portions and portions in vicinity of peripheral portions in which the crushed portions of the opening portions of the metal plate are not present, and defining the top end portions by punching a predetermined portion of the top end portion.

4 Claims, 9 Drawing Sheets

Sectional View

Plan View

Sectional View
The case where a crushed depth is shallow

The case where a crushed depth is deep

Plan View

Plan View

Sectional View

FIG. 6A Plan View
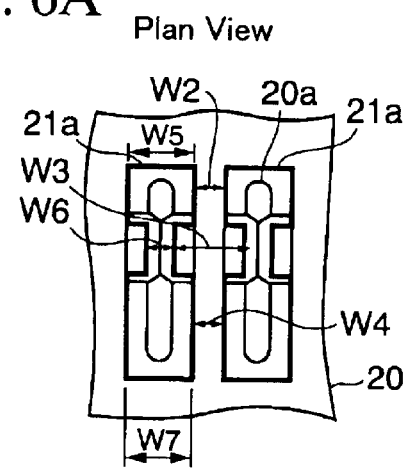
FIG. 6B
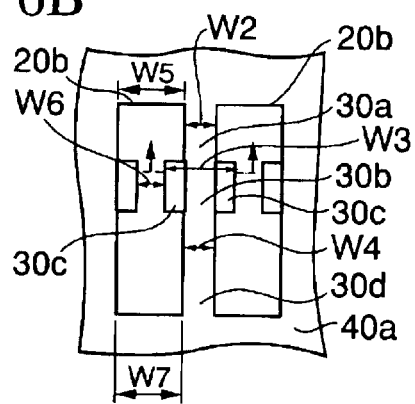
FIG. 6C
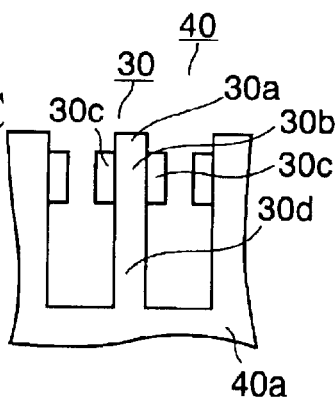
FIG. 6D Sectional View
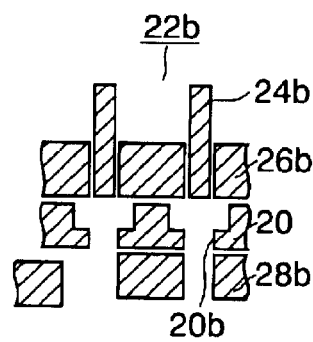
FIG. 6E
FIG. 6F
FIG. 6G
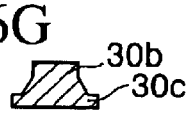
FIG. 6H
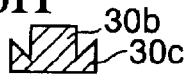

FIG. 9A Plan View
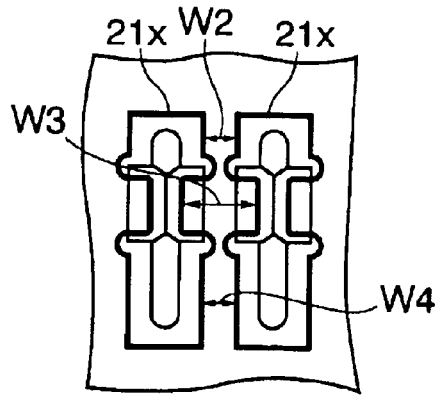
FIG. 9D Sectional View
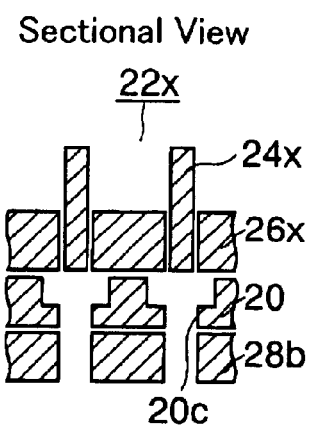
FIG. 9B
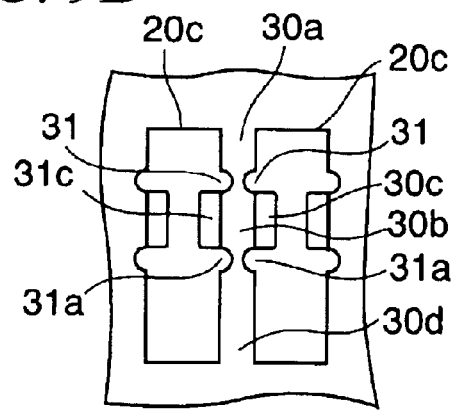
FIG. 9C
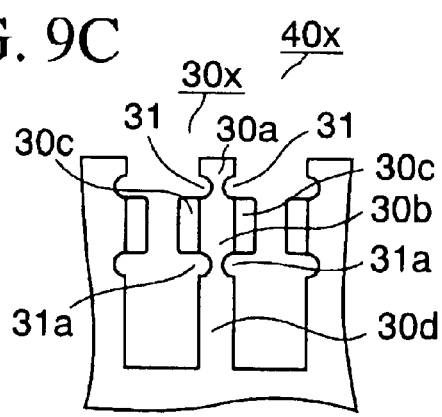

LEAD FRAME MANUFACTURING METHOD

BACKGROUND OF THE INVENTION

1) Field of the Invention

The present invention relates to a lead frame manufacturing method and, more particularly, a method of manufacturing a lead frame employed in a leadless package such as QFN, SON, etc.

2) Description of the Related Art

In recent years, development of the LSI technology as the key technology for implementing the multimedia devices is advanced steadily toward the higher speed and the larger capacity of the data transmission. The higher density of the packaging technology serving as the interface between the LSI and the electronic device is also advanced with the advance of such development.

As the package corresponding to the high-density packaging, various packages are developed up to now. As the package for the high-density packaging using the lead frame, the leadless package such as QFN (Quad Flat Non-leaded Package), SON (Small Outline Non-leaded Package), etc, in which the leads are not extended outward, for example, is well known.

FIG. 1A is a sectional view showing an example of the semiconductor device in which an IC chip is mounted on the leadless package, and FIG. 1B is an enlarged sectional view taken along a II—II line in FIG. 1A. FIG. 2A is a sectional view showing an example of the lead portions of the lead frame employed in the leadless package, and FIG. 2B is a sectional view taken along a III—III line in FIG. 2A.

As shown in FIG. 1A, in a semiconductor device 110 having a QFN structure, an IC chip 104 is mounted on a die pad 102 and also a connection electrode of this IC chip 104 and a lead portion 100 are connected electrically to each other via a wire 108. Then, this IC chip 104 is sealed with molding resin 106 that covers up to a top end portion of the lead portion 100.

In this manner, in the semiconductor device 110 having the QFN structure, an upper surface and side surfaces of the lead portion 100 are covered with the lead portion 100. Therefore, if a sectional shape of this lead portion 100 is a vertical shape, it is possible that the lead portion 100 buried in the molding resin 106 is come off from the molding resin 106.

Therefore, as shown in FIG. 2A and FIG. 2B, a sectional structure of the lead portion 100 of the lead frame is shaped into such a stepped shape that a width of a surface (surface that is connected to the connection electrode of the IC chip) is thicker than a width of a back surface (surface that is connected to the wiring substrate, or the like).

As a result, as shown in FIG. 1B, the molding resin 106 is buried to cut into the side surface of the lead portion 100. Thus, coming-off of the lead portion 100 from the molding resin 106 can be prevented by the so-called anchor effect.

In the prior art, as the method of forming the lead portion 100 having the above sectional structure, mainly wet etching is employed. If wet etching is employed, a substantially same pattern of a resist film is formed on both surfaces of a metal plate, and then the metal plate is etched from both sides by the drug using the pattern of the resist film as a mask. At this time, if etchings of the front and back surfaces of the metal plate are not executed under the same conditions and, for example, such a condition is set that etching of the back surface is executed excessively, the lead portion in which the width of the surface is thicker than the width of the back surface can be formed.

However, the method of working the metal plate by wet etching has drawbacks such that a cost is expensive and a working speed is slow. Hence, stamping using the die, which makes possible a low cost and a quick working speed, is gradually employed.

FIGS. 3A to 3C are views showing a method of forming a stepwise shape, etc. in the lead portion by the stamping (prior art). FIG. 3A is a sectional view taken along a IV-IV line in FIG. 3C.

In the method of forming the stepwise shape, etc. in the lead portion by the stamping in the prior art, as shown in FIGS. 3A to 3C, first the lead portion 100, which has crushed margin portions 100a in predetermined portions on both side surfaces, is formed by punching predetermined portions of the metal plate by the stamping. Then, as shown in FIG. 3B, the die having a punch 112 and a supporting member 114 is prepared and then the crushed margin portions 100a are pushed by using the punch 112 of the die to reduce a thickness. Thus, the stepped shape is formed from both side surface portions to the center portion of the lead portion 100.

In this manner, in the prior art, the crushed margin portion 100a is provided in the predetermined portions on both side surfaces of the lead portion 100, and then the crushed margin portions 100a are pushed/crushed by the punch 112 of the die to shape the lead portions into the stepped shape.

FIGS. 4A to 4D are views showing problems in the method of forming the stepwise shape, etc. in the lead portion by the stamping in the prior art. As shown in FIGS. 4A and 4C, if a crushed portion 100b is formed while setting a crushed depth of the crushed margin portions 100a, which is crushed by the punch 112, shallow (e.g., about ⅓ of a metal plate thickness), spread of the metal is small on the surface S (surface that is connected to the connection electrode of the IC chip) side of the lead portion 100 and thus a sufficient bonding area cannot be assured. Also, as shown in an A portion of FIG. 4A, if the crushed depth is shallow, only an upper portion of the crushed portion 100b is extended in the lateral direction to form a shaving shape and thus the shape to attain a desired anchor effect cannot be obtained.

In contrast, as shown in FIGS. 4B and 4D, if the crushed portion 100c is formed while setting the crushed depth of the crushed margin portions 100a, which is crushed by the punch 112, deep (e.g., about ½ or more of the metal plate thickness), the sufficient bonding area can be assured on the surface S of the lead portion 100, nevertheless there is such a possibility that the crushed portion 100c that is pushed/spread by the punch 112 is spread excessively to contact mutually.

As the countermeasure against the above, there is such a method that the crushed portion 100c is formed by pushing the crushed margin portions 100a up to a depth at which a plurality of lead portions 100 come into contact with each other or come close to each other and then top end portions of a plurality of neighboring crushed portion 100c (portions surrounded by a chain line in FIG. 4D) are punched by the punch of the die such that a plurality of lead portions 100 can assure a desired interval therebetween.

However, since the portions that are punched by the punch are not united together, a punched metal residuum is separated into two pieces freely after the punching. As a result, the punched metal residuum does not stick to the side surface of the supporting member of the die but to the punch, and thus the so-called metal residuum lifting is generated.

In addition, a width of the crushed margin portion 100a of the lead portion 100 will be mentioned. If the width of the crushed margin portion 100a is narrow, the top end portion of the crushed portion is readily shaped into the above shaving shape. If the width of the crushed margin portion 100a is wide, an interval between neighboring lead portions 100 cannot be sufficiently assured since a pitch of the lead portions is decided previously. That is, it is extremely difficult to set the width of the crushed margin portion 100a that makes it possible to get the lead portion 100 with a desired sectional shape.

SUMMARY OF THE INVENTION

It is an object of the present invention to provide a lead frame manufacturing method capable of manufacturing a lead frame, which is employed in a leadless package and has lead portions each having a desired sectional shape, by the stamping not to cause any problem.

The present invention provides a lead frame manufacturing method of manufacturing a lead frame having lead portions, which extend inward from a frame portion like teeth of a comb and each of which has a base portion connected to the frame portion, a center portion connected to the base portion, and side surface portions connected to both side surfaces of the center portion to have a thickness that is smaller than other portions, by a stamping, which comprises the steps of forming a plurality of opening portions, which extend in an extending direction of the lead portions, by punching predetermined portions of a metal plate by virtue of the stamping; forming crushed portions, which extend from crushed margin portions to insides of the opening portions, by pushing the crushed margin portions, which are defined in predetermined portions of the metal plate in vicinity of the opening portions, by virtue of the stamping to reduce a thickness; defining a width between the side surface portion and the center portion to assure an interval between the lead portions and also defining a width of a top end portion connected to the center portion and a width of the base portion, by punching center portions of the crushed portions except predetermined both-side portions and predetermined portions of the metal plate in vicinity of peripheral portions, in which the crushed portions of the opening portions are not present, by virtue of the stamping; and defining the top end portions by punching a predetermined portion of the top end portion by virtue of the stamping.

As described above, in the prior art, the lead portions having the crushed margin portions in both center side-surface portions are formed previously, and then the stepwise shape, or the like is formed by crushing the crushed margin portions. Therefore, there is such a problem that the desired shape cannot be obtained if the crushed depth is set slightly shallowly whereas the desired interval between a plurality of lead portions cannot be assured if the crushed depth is set slightly deep.

In the present invention, as exemplified in FIGS. 5A to 5F and FIGS. 6A to 6H, first a plurality of opening portions 20a that extend long and narrowly in the extending direction of the lead portions are formed by punching the predetermined portions of the metal plate 20 by virtue of the stamping. Then, for example, the crushed margin portions 20x that are defined in vicinity of both edge portions of the center portions of the opening portions 20a of the metal plate 20 are pushed by the stamping to spread from both edge portions of the opening portions 20a to the inside, and thus the crushed portions 21 are formed.

Then, predetermined center portions of the crushed portions 21 and predetermined portions of the metal plate 20 in vicinity of peripheral portions of the opening portions 20a, in which the crushed portions 21 are not present, are punched by the stamping. Thus, a width W2 of the top end portion 30a of the lead portion, a width W3 of the center portion 30b having the side surface portions 30c, and a width W4 of the base portion 30d can be defined, and simultaneously an interval W6 between a plurality of neighboring lead portions can be assured. Then, the predetermined portions of the top end portions 30a are punched by the stamping and cut off from the metal plate 20, whereby the lead frame 40 is manufactured.

In this manner, in the present invention, the predetermined opening portions 20a are formed in the metal plate 20, and then the crushed portions 21 are formed by crushing the crushed margin portions 20x, which are defined in vicinity of both edge portions of the opening portions 20a, to spread to the insides of the opening portions 20a. Then, the predetermined portions of the metal plate are punched by the stamping to define widths of respective portions of the lead portions 30 and to assure the interval between a plurality of lead portions.

Accordingly, the lead portions 30 each consisting of the base portion 30d, the center portion 30b having the side surface portions 30c on both side surfaces, and the top end portion 30a are formed, and also a part of the crushed portions 21 serves as the side surface portions 30c of the lead portions 30. Therefore, the stepwise shape, for example, is formed to extend from the side surface portion 30c to the center portion 30b.

If doing this, there is no need of consideration to assure the intervals between a plurality of lead portions when the crushed margin portions 20x of the metal plate 20 are crushed. Thus, the areas of the crushed portions 21 can be increased by setting the deepish depth of the crushed margin portions 20x. Therefore, the sufficient bonding areas can be assured in the lead portions 30, and also the stepwise shape, or the like having the sufficient anchor effect can be easily formed to extend from the center portion 30b to the side surface portion 30c of the lead portion 30. Also, after the crushed portions 21 are formed, the desired interval between a plurality of lead portions are assured by punching the predetermined portions of the metal plate. Therefore, there is no possibility that a plurality of lead portions are brought into contact with each other.

In the above lead frame manufacturing method, it is preferable that, in the step of defining a width between the side surface portion and the center portion to assure an interval between the lead portions and also defining a width of a top end portion and a width of the base portion, the stamping should be executed by using a die having punches and a supporting member, and a punched metal residuum that is punched by the punch should have such a shape that a peripheral side surface portion of the punched metal residuum comes into contact with a side surface portion of the supporting member of the die over an entire surface.

In this fashion, in the steps of defining the widths of respective portions of the lead portions and the interval between a plurality of lead portions after the opening portions 20a and the crushed portions 21 are formed, the metal plate is punched to have such a shape (a thick frame area 21a in FIG. 6A) that the punched metal residuum is brought into contact with the side surface of the supporting member 28b of the die 22b over the entire peripheral side surface portion. Thus, such a possibility can be eliminated that the metal residuum lifting is generated. As a result, generation of the defective indentations of the lead frames can be prevented and thus the lead frame with high reliability can be manufactured.

In this case, the above drawing numbers and the symbols are quoted to make the understanding of the present invention easy, and they should not be interpreted to limit the present invention.

BRIEF DESCRIPTION OF THE DRAWINGS

FIGS. 6A to 6H are fragmental plan views or fragmental sectional views (#2) showing the lead frame manufacturing method according to the first embodiment of the present invention;

FIGS. 9A to 9D are fragmental plan views or a fragmental sectional view showing a lead frame manufacturing method according to a second embodiment of the present invention.

DESCRIPTION OF THE PREFERRED EMBODIMENTS

Embodiments of the present invention will be explained with reference to the drawings hereinafter.

(First Embodiment)

FIGS. 5A to 5F and FIGS. 6A to 6H are views showing a lead frame manufacturing method according to a first embodiment of the present invention.

Figure 1A:
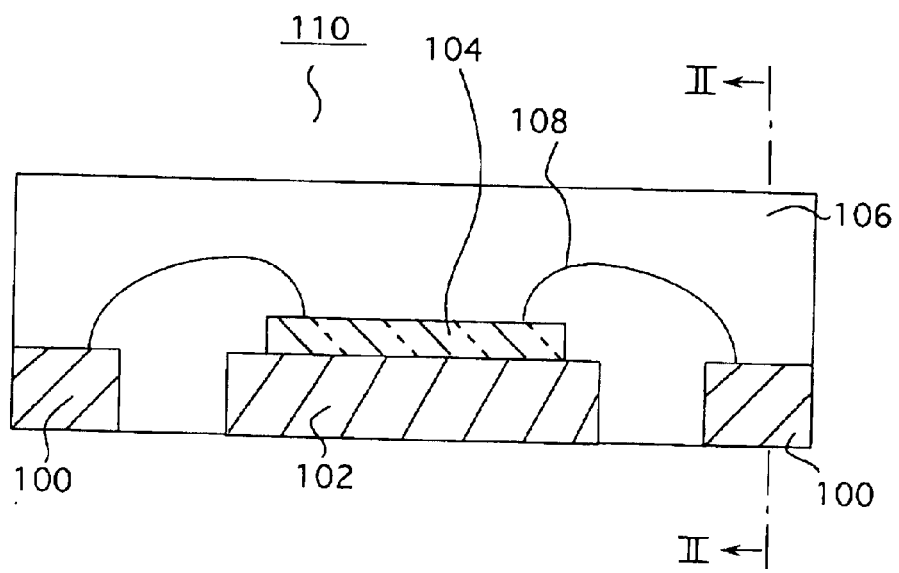
FIG. 1A is a sectional view showing an example of a semiconductor device in which an IC chip is mounted on a leadless package.
Figure 1B:
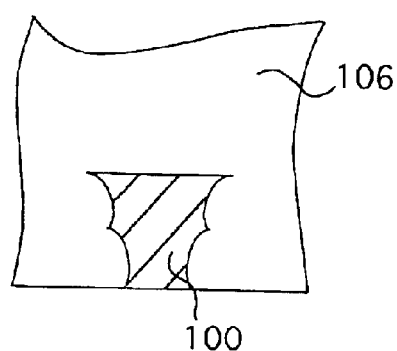
FIG. 1B is an enlarged sectional view taken along a II—II line in FIG. 1A.
Figure 2A:
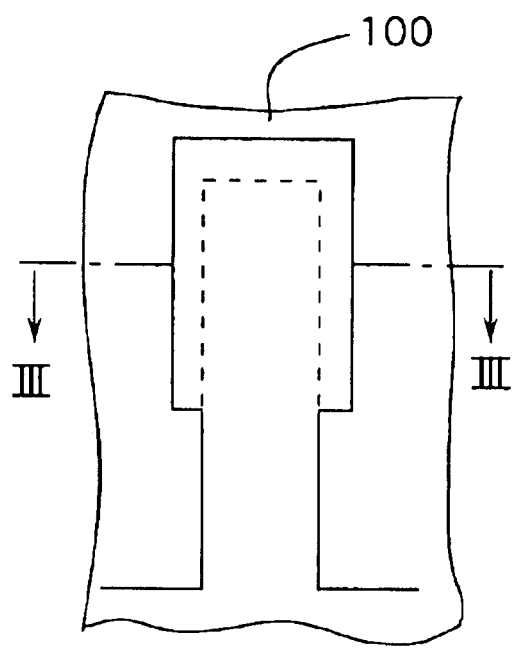
FIG. 2A is a sectional view showing an example of a lead portion of a lead frame employed in the leadless package.
Figure 2B:
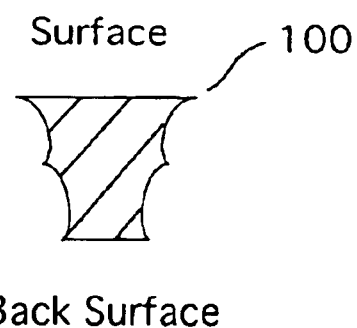
FIG. 2B is a sectional view taken along a III—III line in FIG. 2A.
Figure 3A:
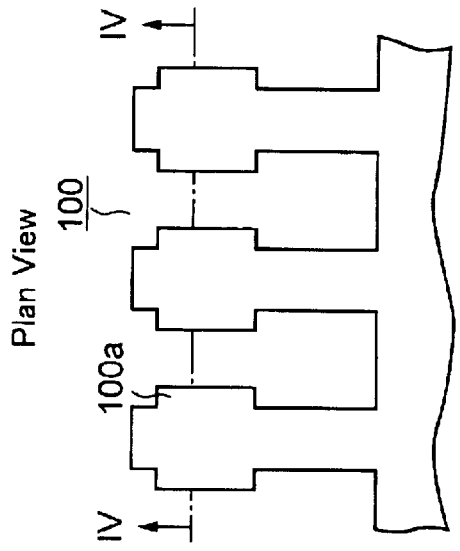
FIGS. 3A to 3C are views showing a method of forming a stepwise shape, etc. in the lead portion by the stamping (prior art)
Figure 3C:
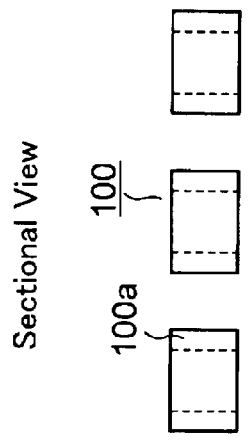
Figure 3B:
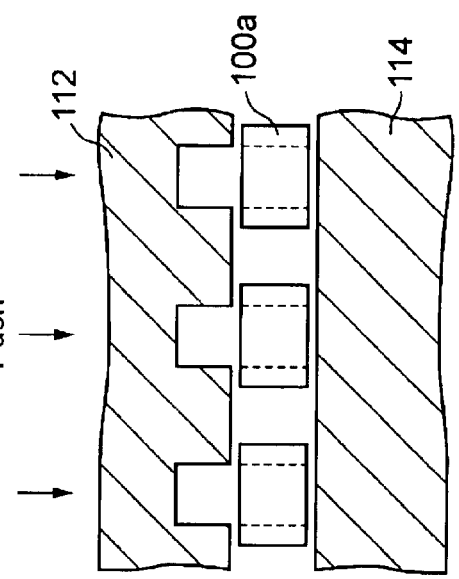
Figure 4A:
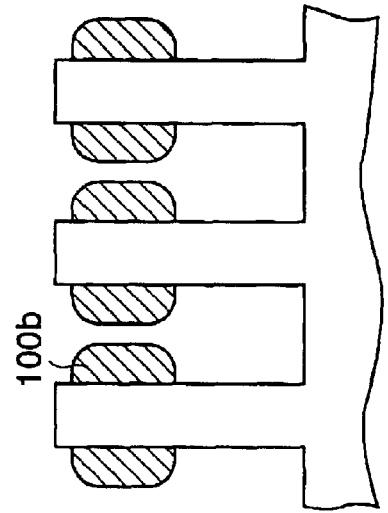
FIGS. 4A to 4D are views showing problems in the method of forming the stepwise shape, etc. in the lead portion by the stamping in the prior art.
Figure 4B:
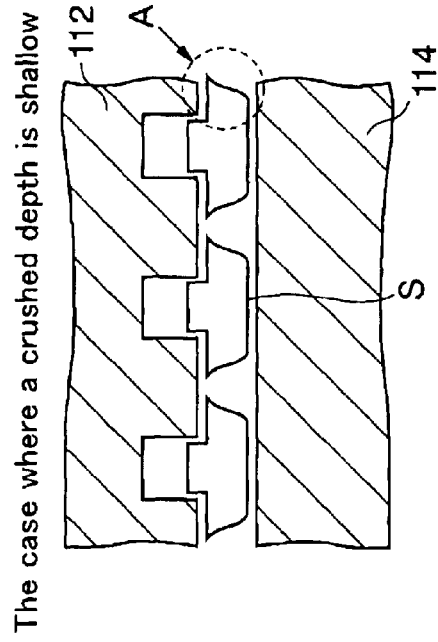
Figure 4C:
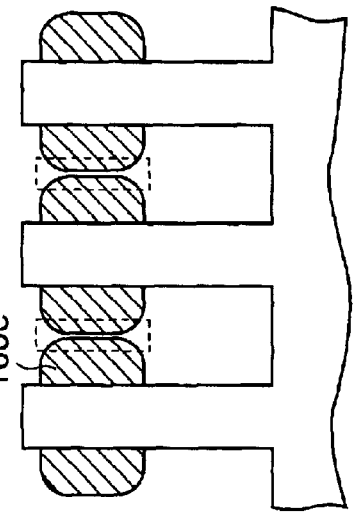
Figure 4D:
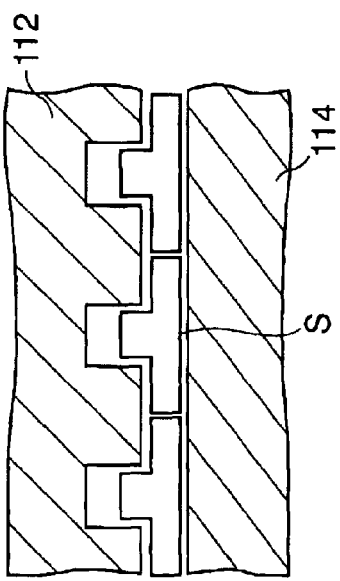
Figure 5A:
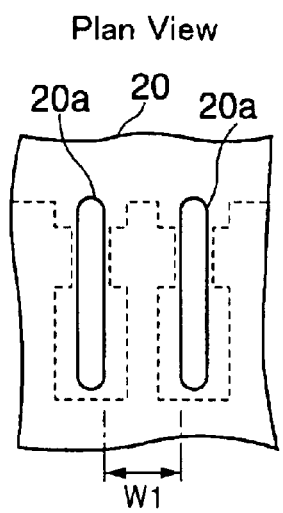
FIGS. 5A to 5F are fragmental plan views or fragmental sectional views (#1) showing a lead frame manufacturing method according to a first embodiment of the present invention.
Figure 5D:
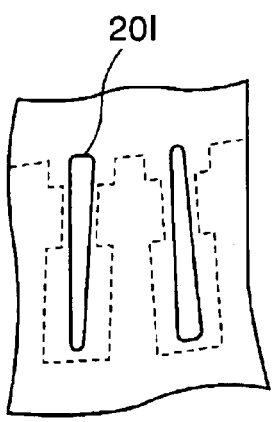
Figure 5F:
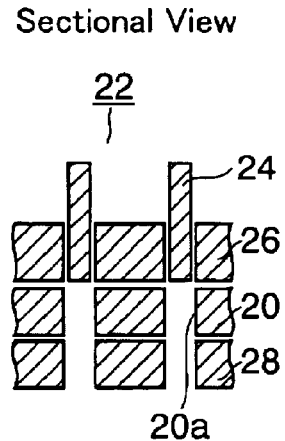

In the lead frame manufacturing method according to the first embodiment of the present invention, as shown in FIGS. 5A, 5D and 5F, first a metal plate 20 such as a Fe—Ni alloy plate, a Cu alloy plate, or the like and having a thickness of about 0.2 mm, for example, and a die 22 are prepared. This die 22 consists basically of first punches 24, a clamping member 26, and a supporting member 28.

Then, the metal plate 20 is inserted between the clamping member 26 and the supporting member 28, and then either the metal plate 20 is punched or a thickness of the metal plate 20 is reduced by pushing predetermined portions of the metal plate 20 by the first punch 24. Thus, the lead frame can be manufactured. The first punches 24 are used to form preliminary punched portions that define roughly a width of a center portion and both side surface portions of the lead portion in the lead frame respectively.

The metal plate 20 is inserted into the die 22 and then the metal plate 20 is pushed/punched by the first punch 24. Thus, as shown in FIG. 5A, a plurality of preliminary punched portions 20a (opening portions) that extend long and narrowly in the direction, along which the lead portions of the metal plate 20 extend, and are positioned in almost parallel mutually are formed. Accordingly, a rough width W1 of the center portion having both side surface portions of the lead portion is defined.

Otherwise, as shown in FIG. 5D, a plurality of preliminary punched portions 20I (opening portions) that extend long and narrowly in the direction, along which the lead portions of the metal plate 20 extend, and are positioned in unparallel mutually may be formed.

In FIG. 5A, for example, a width of the preliminary punched portion 20a is set to about 0.1 mm, a length thereof is set to about 1 mm, a pitch thereof is set to about 0.3 mm, and W1 is set to about 0.20 mm. In this case, FIG. 5F shows an appearance obtained after the preliminary punched portions 20a are formed by punching the metal plate 20 by means of the first punch 24.

Also, a shape indicated by a chain line in FIGS. 5A and 5D shows a rough shape of the lead portion that are to be formed finally. The mutually parallel lead portions are formed in FIG. 5A, and the mutually unparallel lead portions are formed in FIG. 5D.

Figure 5B:
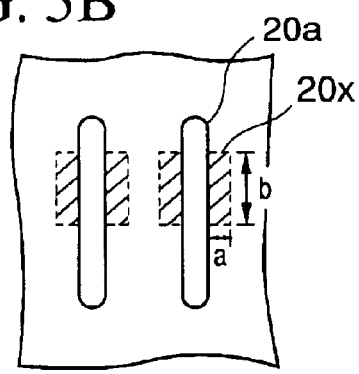

Then, as shown in FIG. 5B, crushed margin portions (hatched portions in FIG. 5B) 20x are defined in the metal plate 20 in vicinity of both edge portions of the centers of the preliminary punched portions 20a. For example, a dimension of the crushed margin portion 20x may be set to about 0.06 mm, and a dimension of thereof may be set to about 0.04 mm. The shape and the dimension of the area of the crushed margin portion 20x are not limited to these. The shape and the dimension may be adjusted appropriately in response to various lead frames. For example, the crushed margin portion 20x may be shaped into a trapezoid, or the like.

Figure 5C:
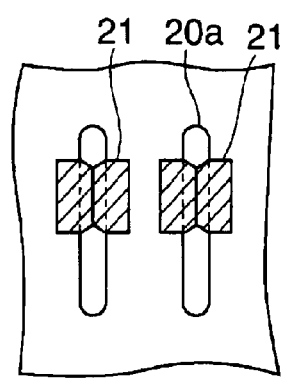
Figure 5E:
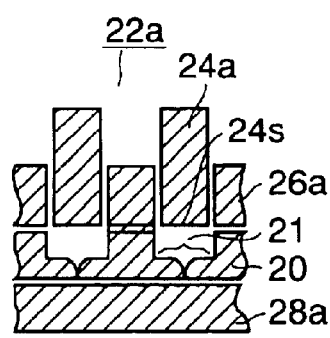

Then, as shown in FIG. 5E, a die 22a having second punches 24a, a clamping member 26a having opening portions corresponding to the second punches, and a supporting member 28a with no opening portion is prepared. In this case, FIG. 5E shows an appearance obtained after the metal plate 20 is pushed by the second punches 24a. The second punches 24a of the die 22a push the crushed margin portions 20x in FIG. 5B to reduce its thickness and to spread into the inside of the preliminary punched portions 20a. Each of the second punches 24a, if viewed as a plan view, is shaped into a quadrilateral including two crushed margin portions 20x, or the like.

Then, as shown in FIGS. 5C and 5E, the metal plate 20 in which the preliminary punched portions 20a are formed is inserted into the die 22a and then the crushed margin portions 20x of the above metal plate 20 are pushed by the second punch 24a. Thus, two crushed margin portions 20x positioned in the neighborhood of both edge portions of the preliminary punched portion 20a are reduced in thickness to about half (e.g., about 0.1 mm) and also they are spread toward the insides of the preliminary punched portion 20a mutually such that their end portions are brought into contact with each other.

In this manner, crushed portions 21 (hatched portions in FIG. 5C) whose thickness is smaller than other portions are formed in predetermined center portions of the preliminary punched portion 20a and their neighboring portions. In this case, a crushed depth of the crushed margin portion 20x of the metal plate 20 may be set to such extent that both edge portions of the preliminary punched portion 20a do not come into contact with each other (less than half of a thickness of the metal plate 20).

A part of the crushed portion 21 formed in this step acts later as both side surface portions of the center portion of the lead portion. Since a thickness of both side surface portions is reduced smaller than the center portion, a stepwise shape, or the like is formed. In this case, as explained later, various sectional shapes of the lead portion may be formed by shaping a pushing surface 24s of the second punch 24a, which is brought into contact with the crushed portion 21, into a three-dimensional shape, and others.

In this manner, the preliminary punched portions 20a are formed in the predetermined portions of the metal plate 20, and then the crushed portions 21 are formed by pushing the crushed margin portions 20x by the second punch 24a to spread. Since the predetermined portions of the crushed portions 21 are punched by the later step to assure the intervals between a plurality of neighboring lead portions, there is no necessity to take it into consideration to assure the intervals between a plurality of neighboring lead portions, etc. in this step.

That is, even if the deepish crushed depth of the crushed portions 21 is set, no disadvantage is caused. Thus, not only the sufficient bonding area can be assured but also a sectional shape of the crushed portions 21 can be shaped into the stepwise shape, or the like having the sufficient anchor effect.

Then, as shown in FIG. 6D, a die 22b having third punches 24b, a clamping member 26b having opening portions corresponding to the third punches, and a supporting member 28b is prepared. In this case, FIG. 6D shows an appearance obtained after the metal plate 20 is pushed/punched by the third punches 24b. Each of the third punches 24b, if viewed as a plan view, has a shape indicated by a thick frame area 21a in FIG. 6A, and defines a width W2 of the top end portion of the lead portion, a width W3 of the center portion having both side surface portions, and a width W4 of the base portion and also defines an interval W5 between the top end portions of a plurality of neighboring lead portions, an interval W6 between the center portions having the side surface portions, and an interval W7 between the base portions.

Then, as shown in FIG. 6D, the metal plate 20 that is shaped into the shape in FIG. 5C is inserted into this die 22b, and then the thick frame areas 21a of the metal plate 20 are punched by the third punches 24b. Thus, as shown in FIG. 6B, punched portions 20b are formed in the metal plate 20, and the top end portions 30a, the side surface portions 30c, the center portions 30b each having the side surface portions 30c, and the base portions 30d of the lead portions are defined. At the same time, the interval W5 between the top end portions 30a of a plurality of neighboring lead portions, the interval W6 between the center portions 30b having the side surface portions 30c, and the interval W7 between the base portions 30d are defined. Also, at this time, the stepwise shape, or the like is formed from the side surface portion 30c to the center portion 30b since the side surface portions 30c of the lead portions have already been pushed and their thickness becomes smaller than the center portions 30b.

For example, both the widths W2 and W4 of the top end portion 30a and the base portion 30d of the lead portion are set to about 0.15 mm respectively, and a total width W3 of the center portion 30b and the side surface portions 30c is set to about 0.20 mm (a width of the side surface portion 30c is set to about 0.04 mm). Also, the intervals W5 and W7 between the top end portions 30a and the base portions 30d of a plurality of neighboring lead portions are set to about 0.24 mm respectively, and the interval W6 between the side surface portions 30c is set to about 0.16 mm.

In this fashion, the shortest interval (the interval W6 between the side surface portions 30c) of the intervals between a plurality of neighboring lead portions can be assured at a desired dimension by punching the predetermined portions of the crushed portions 21 (hatched portions in FIG. 5C) whose thickness is reduced. For this reason, as explained above, since the deepish crushed depth of the crushed portions 21 can be set, the sufficient bonding area can be assured and also the desired interval can be assured between a plurality of lead portions.

In addition, a sectional shape extended from the side surface portion 30c to the center portion 30b of the lead portion (a sectional shape taken along a I—I line in FIG. 6B) is shaped into the stepwise shape, or the like from the center portion 30b to the side surface portion 30c, as shown in FIG.

6E, for example. Thus, the shape that is convenient for the prevention of coming-off of the lead portion 30 from the molding resin is formed.

In the above example, the mode wherein the stepwise shape is formed from the side surface portion 30c to the center portion 30b by using the second punch 24a (FIG. 5E), whose pushing surface 24s that comes into contact with the metal plate 20 is flat, is exemplified. If the pushing surface 24s of the second punch 24a is shaped into a three-dimensional shape, various sectional shapes of the lead portion can be obtained.

That is, for example, if predetermined portions of the pushing surface 24s of the second punch 24a are shaped stepwise, a three-stepped shape can be formed from the side surface portion 30c to the center portion 30b, as shown in FIG. 6F. Similarly, if the pushing surface 24s of the second punch 24a is shaped into a predetermined shape, the stepwise shapes via a tapered surface can be formed from the side surface portion 30c to the center portion 30b, as shown in FIG. 6G. Alternatively, a two-stepped shape a thickness of the side surface portion 30c of which is increased toward its edge side can be formed, as shown in FIG. 6H. It is needless to say that the sectional shape of the lead portion can be shaped into various shapes having the anchor effect in addition to the above shapes.

Also, if respective dimensions of the preliminary punched portion 20a (FIG. 5A), the crushed portion 21 (FIG. 5C), and the punched portion 20b (FIG. 6B) are adjusted appropriately and combined together, widths of respective portions of the lead portion, the interval between a plurality of lead portions, or the sectional shape of the lead portion can be adjusted easily. Therefore, unlike the prior art, a dimension of the crushed margin portion used to shape the cross section of the lead portion into the desired shape, etc. can be readily set.

In addition, when the metal plate 20 is punched by the third punch 24b, the punched metal residuum sticks strongly to the side surface of the supporting member 28b because the thick frame area 21a in FIG. 6A, i.e., the peripheral side surface portion of the punched metal residuum, has such a shape that comes into contact with the side surface of the supporting member 28b over the entire surface. Thus, since such a possibility can be eliminated that the punched metal residuum sticks to the third punch 24b, generation of the metal residuum lifting can be prevented. At this time, the generation of the metal residuum lifting can be prevented similarly even when the punch that is divided into two pieces near the center portion is employed as the third punch 24b.

Then, a die (not shown) having fourth punches to punch predetermined portions of the top end portions 30a is prepared. Then, the top end portions 30a are cut off from the metal plate 20 by punching the predetermined portions of the top end portions 30a by means of the fourth punches of this die. Thus, as shown in FIG. 6C, a lead frame 40 having the lead portions 30 each consisting of the base portion 30d connected to a frame portion 40a, the center portion 30b having the side surface portions 30c, and the top end portion 30a is completed.

In this case, all the top end portions 30a may be removed by cutting boundary portions between the center portions 30b and the top end portions 30a. Also, the bonding areas that are connected to the IC chip may be spread by applying the coining process to the top end portions 30a before or after the top end portions 30a are cut off from the metal plate 20.

As described above, in the lead frame manufacturing method according to the present embodiment, the preliminary punched portions 20a are formed in the predetermined portions of the metal plate 20, and then the crushed margin portions 20x of the metal plate 20 located in vicinity of both edge portions of the preliminary punched portions 20a are pushed to spread to the insides of the preliminary punched portions 20a, so that the crushed portions 21 are formed.

Then, intervals between the top end portions 30a, the center portions 30b having the side surface portions 30c, and the base portions 30d of the lead portions 30 and between a plurality of neighboring lead portions are defined by punching predetermined center portions of the crushed portions 21 and the predetermined portions (near the peripheral portions of the preliminary punched portions 20a in which the crushed portions 21 are not present) of the metal plate 20. Then, the lead frame 40 can be manufactured by cutting apart the top end portions 30a from the metal plate 20.

If doing this, the sufficient bonding areas can be assured because the deepish depth of the crushed portion can be set, and also the desired interval can be assured between a plurality of lead portions because the intervals of a plurality of lead portions are formed by the punching to have the desired width.

Also, the desired stepwise shape, or the like can be easily obtained to extend from the center portion 30b to the side surface portion 30c, and thus the coming-off of the lead portion 30 from the molding resin can be prevented. Also, in the steps of punching the predetermined portions of the crushed portions 21 of the metal plate 20 by the punch to define the intervals of the lead portions, the metal plate is punched such that the punched metal residuum is brought into contact with the side surface of the supporting member of the die over its entire peripheral side surface portion. Therefore, there is no possibility that the metal residuum lifting is generated, and also generation of the defective indentations of the lead frames can be prevented.

In addition, in the lead portion 30 of the present embodiment, the stepwise shape, or the like is formed by reducing a thickness of the side surface portion 30c of the lead portion 30 rather than thicknesses of other portions, and also thicknesses of the portions other than the side surface portion 30c are identical to the plate thickness of the metal plate 20 before the shaping. Therefore, such structure is also advantageous from the viewpoint of improving the strength of the lead portion 30.

Figure 7:
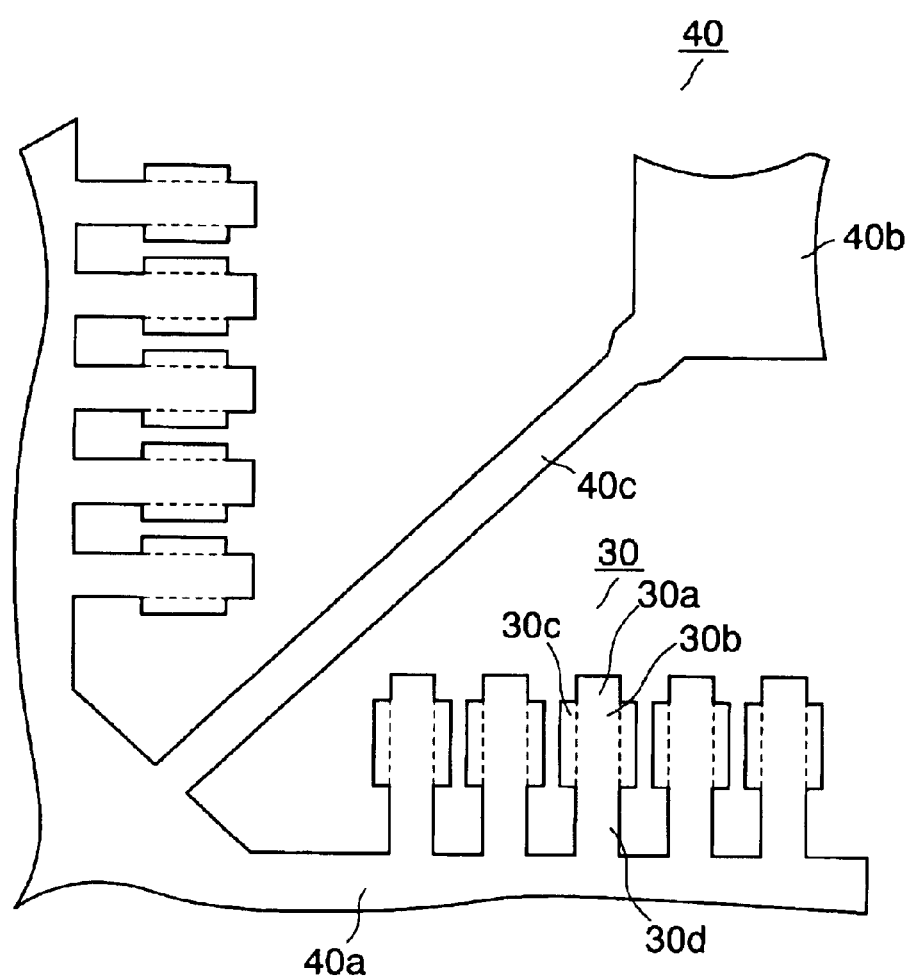
FIG. 7 is a fragmental plan view showing a lead frame that is manufactured by the lead frame manufacturing method according to the first embodiment of the present invention.

Next, an overall appearance of the lead frame 40 of the present embodiment will be explained with reference to a fragmental plan view hereunder. FIG. 7 is a fragmental plan view showing the lead frame according to the first embodiment of the present invention. The lead frame 40 shown in FIG. 7 shows the state in which the lead portions 30 in FIG. 6C are reversed. As shown in FIG. 7, in the lead frame 40 of the present embodiment, a quadrilateral die pad 40b on which a semiconductor chip is mounted is arranged in a center portion of a frame portion 40a, and then this die pad 40b is supported by support bars 40c that extend from corners of the frame portion 40a. Then, a plurality of lead portions 30 shown in FIG. 6C are extended from the frame portion 40a toward the die pad 40b like the teeth of a comb to constitute the lead frame 40.

In the lead frame 40 of the present embodiment, the semiconductor chip is mounted on the die pad 40b, and then connection electrodes of the semiconductor chip are connected electrically to the center portions 30b of the lead portions 30 via wires. Then, the molding resin is applied up to the boundaries between the center portions 30b and the base portions 30d, and then the connecting portions between the base portions 30d and the center portions 30b are cut, whereby the semiconductor device is manufactured.

Figure 8:
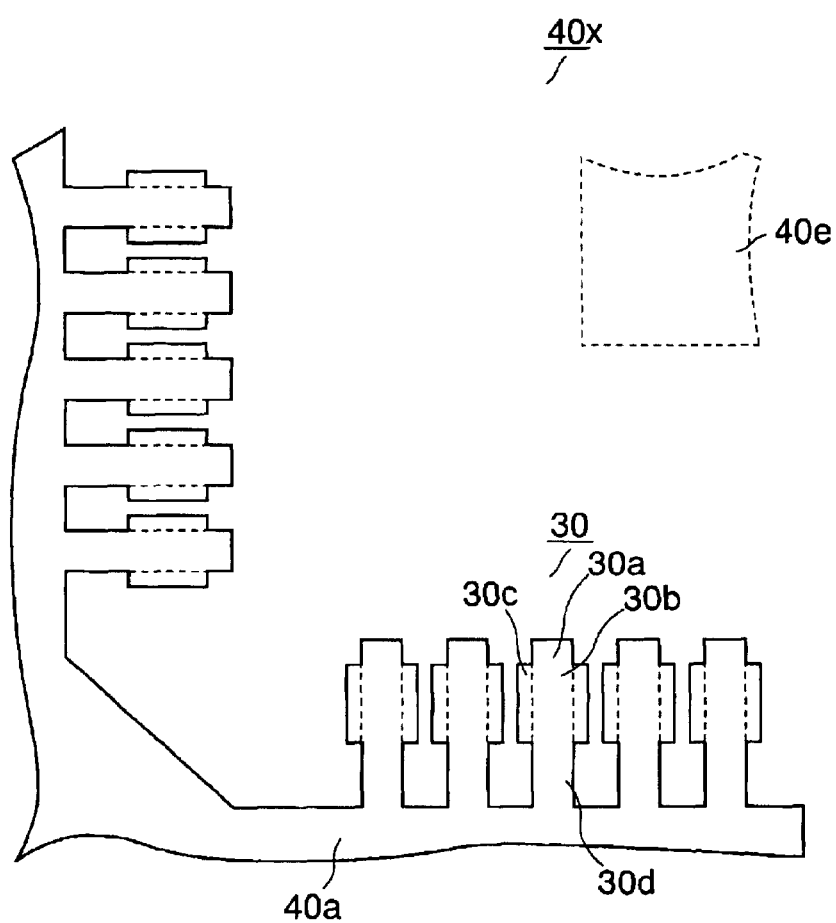
FIG. 8 is a fragmental plan view showing a variation of the lead frame that is manufactured by the lead frame manufacturing method according to the first embodiment of the present invention.

FIG. 8 is a fragmental plan view showing a lead frame according to a variation of the first embodiment of the present invention. As shown in FIG. 8, a lead frame 40x in the variation of the first embodiment has a structure that the die pad portion 40b is omitted from the lead frame 40 shown in FIG. 7. Then, like the lead frame 40 shown in FIG. 7, a plurality of lead portions 30 shown in FIG. 6C are extended from a frame portion 40a toward the inside like the teeth of the comb to constitute the lead frame 40x.

In the lead frame 40x according to the variation of the present embodiment, the semiconductor device is manufactured by arranging the semiconductor chip at a position of a center portion 40e in a hollow area on the inside of the frame portion 40a. In other words, first a tape is pasted onto a back surface of the lead frame 40x shown in FIG. 8, and then the semiconductor chip is mounted on the tape in the center portion 40e in the hollow area. Then, the connection electrodes of the semiconductor chip are connected electrically to the center portions 30b of the lead portions 30 via the wires.

Then, the molding resin is applied up to the boundaries between the center portions 30b and the base portions 30d of the lead portions 30. Thus, not only the lead portions 30 but also the semiconductor chip is fixed by the molding resin. Then, the tape is peeled off and also the connecting portions between the base portions 30d and the center portions 30c are cut, whereby the semiconductor device is manufactured.

In this manner, the semiconductor device in which the semiconductor chip is packaged in the leadless package such as QFN, SON, or the like can be manufactured by using the lead frames 40, 40x in the present embodiment. Each of the back surfaces (surfaces that are connected to the wiring substrate, or the like) of the lead portions 30 of the lead frame 40, 40x is shaped into the stepwise shape, or the like from the center portion 30b to the side surface portion 30c, as shown in FIG. 6E to FIG. 6H. As a result, the sufficient anchor effect can be achieved and thus the coming-off of the lead portions 30 from the molding resin can be prevented.

(Second Embodiment)

FIGS. 9A to 9D are fragmental plan views or a fragmental sectional view showing a lead frame manufacturing method according to a second embodiment of the present invention. A different point of the second embodiment from the first embodiment is that a neck portion is provided between the top end portion and the side surface portion of the lead portions and between the side surface portion and the base portion respectively. In FIGS. 9A to 9D, the same symbols are affixed to the same elements as those in FIGS. 5A to 5E and FIGS. 6A to 6H, and their explanation will be omitted herein.

In the steps of forming the punched portions 20b by the third punches 24b in the first embodiment (FIGS. 6A and 6B), if the punched portions 20b are formed to displace in the lateral direction, lines of both edge portions of the top end portions 30a and the base portions 30d and crushed lines of the boundary portions between the side surface portions 30c and the center portions 30b are not aligned on a same line respectively and are deviated. Therefore, the case where such a disadvantage is caused that its appearance is bad is supposed. The second embodiment is provided to overcome such disadvantage.

In the lead frame manufacturing method according to the second embodiment of the present invention, first the structure shown in FIG. 5C is formed by the same method as the first embodiment. Then, as shown in FIG. 9D, a die 22x having third punches 24x, a clamping member 26x having opening portions corresponding to the third punches 24x, and a supporting member 28b is prepared.

The third punch 24x, if viewed as a plan view, has a shape indicated by a thick frame area 21x in FIG. 9A. The third punch 24x is used not only to define widths and intervals between respective portions of the lead portions, like the first embodiment, but also to provide the neck portion between the top end portion and the side surface portion and between the side surface portion and the base portion respectively.

Then, as shown in FIG. 9D, the metal plate 20 that is shaped into the shape in FIG. 5C is inserted into this die 22x, and then the thick frame areas 21x of the metal plate 20 are punched by the third punches 24x. Thus, as shown in FIG. 9B, punched portions 20c are formed in the metal plate 20. Like the first embodiment, widths of the top end portion 30a, the side surface portion 30c, and the center portion 30b having the side surface portions 30c, and the base portion 30d of the lead portion are defined respectively and at the same time intervals between a plurality of neighboring lead portions are assured. In addition, a first neck portion 31 is formed in the connecting portion between the top end portion 30a and the side surface portion 30c, and also a second neck portion 31a is formed in the connecting portion between the side surface portion 30c and the base portion 30d.

Then, according to the same method as the first embodiment, the predetermined portions of the top end portions 30a are cut away from the metal plate 20 by the punching by virtue of the die. In this case, like the first embodiment, the coining process may be applied to the top end portions 30a to spread their area before or after the top end portions 30a are cut away from the metal plate 20.

Accordingly, as shown in FIG. 9C, the lead frame 40x having the lead portions 30x, which are manufactured by the lead frame manufacturing method in the second embodiment, is completed.

In the lead frame 40x in the second embodiment, the first neck portion 31 is provided to the connecting portion between the top end portion 30a and the side surface portion 30c, and also the second neck portion 31a is provided to the connecting portion between the side surface portion 30c and the base portion 30d.

Therefore, if lines of both end portions of the top end portions 30a and the base portions 30d do not coincide with the crushed lines on the same straight lines because the punched portions 20c are displaced in the lateral direction in the steps in FIGS. 9A and 9B, these lines are disconnected at the first and second neck portions 31, 31a and thus displacement of these lines becomes inconspicuous. As a result, such a drawback can be overcome that the appearance of the lead frame is bad.

In this case, if projected portions that are projected to the outside of the lead portion are formed at these positions in place of formation of the first and second neck portions 31, 31a, the similar advantages can be achieved. Like the first embodiment, either the lead frame with the die pad portion or the lead frame without the die pad portion may be employed as the lead frame in the second embodiment.

What is claimed is:

1. A lead frame manufacturing method of manufacturing a lead frame having lead portions, which extend inward from a frame portion like teeth of a comb and each of which has a base portion connected to the frame portion, a center portion connected to the base portion, and side surface portions connected to both side surfaces of the center portion to have a thickness that is smaller than other portions, by a stamping, comprising the steps of:

forming a plurality of opening portions, which extend in an extending direction of the lead portions, by punching predetermined portions of a metal plate by virtue of the stamping;

forming crushed portions, which extend from crushed margin portions to insides of the opening portions, by pushing the crushed margin portions, which are defined in predetermined portions of the metal plate in vicinity of the opening portions, by virtue of the stamping to reduce a thickness;

defining a width of the side surface portion and the center portion to assure an interval between the lead portions and also defining a width of a top end portion and a width of the base portion connected to the center portion, by punching center portions of the crushed portions except predetermined both-side portions and predetermined portions of the metal plate in vicinity of peripheral portions, in which the crushed portions of the opening portions are not present, by virtue of the stamping; and defining the top end portions by punching a predetermined portion of the top end portion by virtue of the stamping.

2. A lead frame manufacturing method according to claim 1, wherein, in the step of forming the crushed portions, a thickness of the crushed margin portion is reduced to at least almost half of a thickness of the metal plate such that metal portions that extend from both end portions of the opening portions are brought into contact with each other.

3. A lead frame manufacturing method according to claim 1, wherein, in the step of defining a width between the side surface portion and the center portion to assure an interval between the lead portions and also defining a width of a top end portion and a width of the base portion, the stamping is executed by using a die having punches and a supporting member, and a punched metal residuum that is punched by the punch has such a shape that a peripheral side surface portion of the punched metal residuum comes into contact with a side surface portion of the supporting member of the die over an entire surface.

4. A lead frame manufacturing method according to claim 1, wherein, in the step of defining a width between the side surface portion and the center portion to assure an interval between the lead portions and also defining a width of a top end portion and a width of the base portion, at a same time a first neck portion is formed in a connecting portion between the top end portion and the side surface portion and also a second neck portion is formed in a connecting portion between the side surface portion and the base portion.

* * * * *